(12) United States Patent
Zhang et al.

(10) Patent No.: US 12,237,279 B2
(45) Date of Patent: Feb. 25, 2025

(54) SENSING SUBSTRATE AND ELECTRONIC DEVICE

(71) Applicants: BEIJING BOE SENSOR TECHNOLOGY CO., LTD., Beijing (CN); BOE TECHNOLOGY GROUP CO., LTD., Beijing (CN)

(72) Inventors: Guan Zhang, Beijing (CN); Jianxing Shang, Beijing (CN); Huinan Xia, Beijing (CN); Bin Zhao, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/359,967

(22) Filed: Jul. 27, 2023

(65) Prior Publication Data

US 2023/0378101 A1 Nov. 23, 2023

Related U.S. Application Data

(63) Continuation of application No. 17/789,829, filed as application No. PCT/CN2021/104981 on Jul. 7, 2021, now Pat. No. 11,764,170.

(30) Foreign Application Priority Data

Aug. 12, 2020 (CN) .......................... 202010804976.X (51) Int. Cl.
*H01L 23/60* (2006.01)
*G01T 1/20* (2006.01)
*H01L 27/146* (2006.01)

(52) U.S. Cl.
CPC ............ *H01L 23/60* (2013.01); *G01T 1/2018* (2013.01); *H01L 27/14636* (2013.01); *H01L 27/14663* (2013.01)

(58) Field of Classification Search
CPC ............... H01L 23/60; H01L 27/14636; H01L 27/14663; H01L 27/144; H01L 27/1443; G01T 1/2018; G01T 1/20185
See application file for complete search history.

(56) References Cited

U.S. PATENT DOCUMENTS 3,836,793 A * 9/1974 Haitz .................. H01L 27/1443
257/E27.128
9,986,669 B2 5/2018 Uprety et al.
(Continued)

FOREIGN PATENT DOCUMENTS

CN 101216626 A 7/2008
CN 104037179 A 9/2014
(Continued)

OTHER PUBLICATIONS

U.S. Notice of Allowance from U.S. Appl. No. 17/789,829 with a mailing date of May 24, 2023.
(Continued)

*Primary Examiner* — Kiho Kim
(74) *Attorney, Agent, or Firm* — Dilworth & Barrese, LLP.; Michael J. Musella, Esq.

(57) ABSTRACT

A sensing substrate and an electronic device are provided. The sensing substrate includes a sensing unit on a base substrate. The sensing unit includes a sensing element and a conductive pattern, the sensing element has a light incident surface and a back surface that are opposite and a side surface between the light incident surface and the back surface. The conductive pattern is on a side of the sensing element away from the base substrate, and has a hollow portion and a transparent conductive portion surrounding the hollow portion, an orthographic projection of the hollow portion on the base substrate is at least partially within an orthographic projection of the sensing element on the base substrate, and an orthographic projection of the transparent
(Continued)

conductive portion on the base substrate at least partially overlaps with an orthographic projection of the side surface of the sensing element on the base substrate.

20 Claims, 7 Drawing Sheets

(56) References Cited

U.S. PATENT DOCUMENTS

| | | | |
|---|---|---|---|
| 10,338,234 B2 | 7/2019 | Maeda et al. |
| 10,879,304 B2 | 12/2020 | Misaki |
| 11,404,469 B2 | 8/2022 | Zhang et al. |
| 2008/0013683 A1 | 1/2008 | Shinden et al. |
| 2012/0235026 A1 | 9/2012 | Wu |
| 2013/0099126 A1 | 4/2013 | Iwata et al. |
| 2015/0122995 A1 | 5/2015 | Mabuchi et al. |
| 2015/0295006 A1 | 10/2015 | Chen et al. |
| 2016/0049431 A1 | 2/2016 | Taghibakhsh |
| 2022/0278146 A1 | 9/2022 | Hou et al. |

FOREIGN PATENT DOCUMENTS

| | | |
|---|---|---|
| CN | 106405960 A | 2/2017 |
| CN | 107407990 A | 11/2017 |
| CN | 108367972 A | 8/2018 |
| CN | 108389643 A | 8/2018 |
| CN | 109671729 A | 4/2019 |
| CN | 110164884 A | 8/2019 |
| CN | 110335876 A | 10/2019 |
| CN | 110660816 A | 1/2020 |

OTHER PUBLICATIONS

Written Opinion and International Search Report in International Application No. PCT/CN2021/104981 Mailed Sep. 28, 2021.

* cited by examiner

SENSING SUBSTRATE AND ELECTRONIC DEVICE

CROSS REFERENCE TO RELATED APPLICATIONS

The present application is a Continuation application of U.S. application Ser. No. 17/789,829, which is the National Stage of PCT/CN2021/104981 filed on Jul. 7, 2021, which claims the benefits of and priority of Chinese Patent Application No. 202010804976.X filed on Aug. 12, 2020, and entitled "Sensing Substrate and Electronic Device," and the entire content disclosed by the Chinese patent application is incorporated herein by reference as part of the present application for all purposes.

TECHNICAL FIELD

Embodiments of the present disclosure relate to a sensing substrate and an electronic device including the sensing substrate.

BACKGROUND

An X-ray flat panel detector can convert "X-rays" invisible to the naked eyes into "digital signals" that can eventually be converted into an image. The X-ray flat panel detector (FPXD) has the advantages of high sensitivity of a signal reading IC (Integrated Circuit) and the ability to detect slight change in electricity.

An amorphous silicon (a-Si) X-ray flat panel detector is one of the core detection and imaging components of a digital radiography (DR) system in the X-ray field, and has longer X-ray irradiation life and stability compared with a CMOS structure and a CCD structure, so that the amorphous silicon X-ray flat panel detector has gradually become the mainstream demand in the current and future markets.

One of the core technologies of the a-Si FPXD lies in the pixel design. A good pixel design can ensure that the effective photosensitive structure occupies the pixel area ratio (also known as the pixel filling rate) as large as possible; in a case where the pixel filling rate is constant, the light transmittance on the light incident side of the pixel should also be as large as possible, so that the electrodes on the light incident side of the photosensitive structure are generally made of transparent conductive materials.

SUMMARY

Embodiments of the present disclosure provide a sensing substrate and an electronic device including the sensing substrate, and the sensing substrate can avoid the phenomenon of image unevenness occurring in the electronic device during an imaging process.

An embodiment of the present disclosure provides a sensing substrate, which comprises a base substrate, and a sensing unit on the base substrate. The sensing unit comprises: a sensing element on the base substrate, in which the sensing element has a light incident surface and a back surface that are opposite to each other and a side surface between the light incident surface and the back surface, the light incident surface is on a side of the back surface away from the base substrate; and a conductive pattern on a side of the sensing element away from the base substrate, in which the conductive pattern has a hollow portion and a transparent conductive portion surrounding the hollow portion, an orthographic projection of the hollow portion on the base substrate is at least partially within an orthographic projection of the sensing element on the base substrate, and an orthographic projection of the transparent conductive portion on the base substrate at least partially overlaps with an orthographic projection of the side surface of the sensing element on the base substrate.

For example, the orthographic projection of the side surface on the base substrate is within the orthographic projection of the transparent conductive portion on the base substrate.

For example, the orthographic projection of the transparent conductive portion on the base substrate is in a closed frame structure.

For example, the conductive pattern is configured to be applied with a fixed voltage when the sensing element operates.

For example, the sensing substrate further comprises a bias line layer, a first insulating layer, and a second insulating layer on the base substrate, the bias line layer comprises a bias signal line, in a direction perpendicular to the base substrate, the first insulating layer is between the sensing element and the conductive pattern; and the second insulating layer is between the bias signal line and the conductive pattern.

For example, the conductive pattern comprises a conductive pattern expansion portion beyond the light incident surface of the sensing element; an orthographic projection of the light incident surface of the sensing element on the base substrate has a concave portion, and the concave portion accommodates an orthographic projection of at least a portion of the conductive pattern expansion portion on the base substrate.

For example, the bias signal line is electrically connected to the sensing element and is electrically connected to the conductive pattern.

For example, the second insulating layer comprises a hole penetrating the second insulating layer, the conductive pattern is electrically connected to the bias signal line through the hole, and an orthographic projection of the hole on the base substrate at least partially overlaps with the orthographic projection of the transparent conductive portion of the conductive pattern on the base substrate.

For example, the bias signal line comprises a bias line excess portion beyond the light incident surface of the sensing element, and the bias line excess portion is electrically connected to the conductive pattern through the hole.

For example, the sensing unit further comprises a switching element, and an orthographic projection of the switching element on the base substrate is at least partially within an orthographic projection of the bias line excess portion on the base substrate.

For example, the sensing substrate comprises a plurality of sensing units spaced apart from each other, and conductive patterns of the plurality of sensing units are independent of each other.

For example, the whole conductive pattern is separated from the bias signal line by the second insulating layer.

For example, the sensing substrate comprises a plurality of sensing units spaced apart from each other, and comprises a plurality of first conductive bridges spaced apart from each other and a plurality of second conductive bridges spaced apart from each other on the base substrate, each of the plurality of first conductive bridges extends along a first direction and electrically connects conductive patterns of adjacent sensing units in the first direction, each of the plurality of second conductive bridge extends along a second direction and electrically connects conductive patterns of adjacent sensing units in the second direction, and the second direction is different from the first direction.

For example, conductive patterns of the plurality of sensing units are arranged in a plurality of conductive pattern columns, a plurality of first conductive pattern rows, and a plurality of second conductive pattern rows; adjacent conductive patterns in a same conductive pattern column are electrically connected through the first conductive bridge; adjacent conductive patterns in a same first conductive pattern row are electrically connected through the second conductive bridge; adjacent conductive patterns in a same second conductive pattern row are independent of each other; and the plurality of first conductive pattern rows and the plurality of second conductive pattern rows are alternately arranged.

For example, the bias line layer comprises a plurality of bias signal lines spaced apart from each other, an orthographic projection of each of the plurality of bias signal lines on the base substrate overlaps with orthographic projections of the first conductive bridges arranged in sequence along the first direction on the base substrate.

For example, the sensing substrate comprises a sensing region and a frame region surrounding the sensing region; in the frame region, the sensing substrate comprises a bias short-circuit ring and a plurality of third conductive bridges spaced apart from each other on the base substrate, the bias short-circuit ring is electrically connected to conductive patterns of sensing units adjacent to the bias short-circuit ring through the plurality of third conductive bridges, respectively.

For example, the sensing substrate further comprises a binding region and a protection pattern, the bias line layer comprises a bias line signal terminal in the binding region, the protection pattern and the conductive pattern are in a same layer and in the binding region, and the protection pattern is in direct contact with the bias line signal terminal.

For example, the sensing unit further comprises a switching element, the switching element is electrically connected to the sensing element, and an orthographic projection of the switching element on the base substrate is outside an orthographic projection of the light incident surface of the sensing element on the base substrate.

For example, an orthographic projection of the conductive pattern on the base substrate overlaps with an orthographic projection of at least a portion of the switching element on the base substrate.

For example, the sensing element comprises a first electrode and a second electrode disposed opposite to each other, the first electrode is between the second electrode and the base substrate in a direction perpendicular to the base substrate; the sensing element further comprises a semiconductor layer between the first electrode and the second electrode in the direction perpendicular to the base substrate, and an orthographic projection of the transparent conductive portion on the base substrate at least partially overlaps with an orthographic projection of a side surface of the semiconductor layer on the base substrate.

An embodiment of the present disclosure provides an electronic device, which comprises the sensing substrate provided by any one of the above embodiments.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
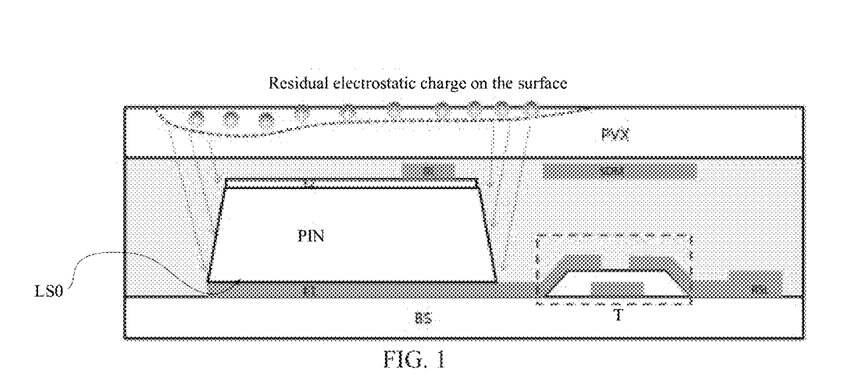
FIG. 1 is a simplified cross-sectional schematic diagram of a pixel structure of an X-ray flat panel detector.

FIG. 1 is a simplified cross-sectional schematic diagram of a pixel structure of an X-ray flat panel detector. As shown in FIG. 1, the X-ray flat panel detector includes a base substrate BS and structures, such as a photosensitive element LS0, a switching element T, an insulating layer PVX, and the like, located on the base substrate BS. For example, the photosensitive element LS0 includes a first electrode E1 and a second electrode E2 disposed opposite to each other and a PIN-type semiconductor layer PIN between the first electrode E1 and the second electrode E2, that is, an intrinsic semiconductor layer (i.e., an I-type semiconductor layer) is sandwiched between a P-type semiconductor layer and an N-type semiconductor layer. The second electrode E2 of the photosensitive element LS0 is electrically connected to a bias signal line BL, so that the photosensitive element LS0 is applied with a bias voltage during operation, and the bias voltage sets the photosensitive element LS0 in a biased state. The first electrode E1 of the photosensitive element LS0 is electrically connected to the switching element T, and a read signal line RSL is electrically connected to the switching element T to read the output signal of the photosensitive element LS0. A light-shielding structure SDM is disposed on the upper side of the switching element T, and the light-shielding structure SDM is disposed in the same layer as the bias signal line BL.

The inventor(s) of the present disclosure noticed during research that in FIG. 1, no protection structure is provided above the sidewall of the semiconductor layer PIN, when the product is disturbed by uneven external potential or is affected by unevenly distributed charged ions, a new electric field is generated due to the mechanism of induced electrons, and the electric field is superimposed with the original reverse bias electric field vector of the PIN, resulting in inconsistent electric field between pixels, and then a phenomenon that the amounts of electron migration of different pixels are different in the same integration time, this is manifested as uneven grayscale in the product image, i.e. Mura appears on the image. On the other hand, the requirement of image quality uniformity for the X-ray flat-panel detector imaging also requires that the pixel electrical differences in respective positions of the entire detector are as small as possible. In this case, because the uppermost layer of the pixel structure shown in FIG. 1 is protected by the insulating layer PVX, the surface of the insulating layer PVX is very prone to local electrostatic residues, which will affect the lateral electric field of the underlying PIN structure, as a result, the image distributed along with electrostatic distribution is uneven, which seriously affects the imaging quality.

In order to improve the imaging quality, the embodiments of the present disclosure provide a sensing substrate and an electronic device including the sensing substrate.

Figure 2A:
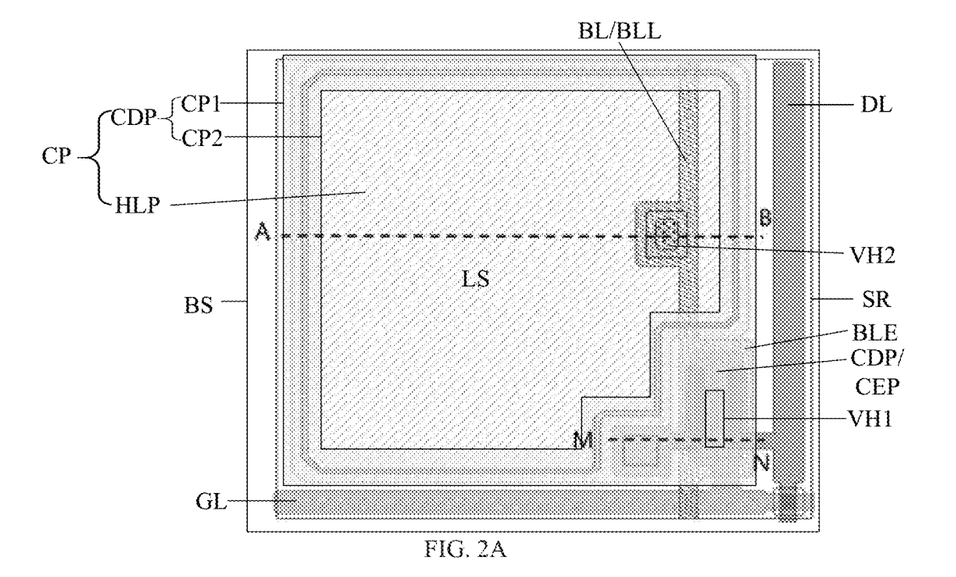
FIG. 2A is a first partial top-view schematic diagram of a sensing substrate provided by an embodiment of the present disclosure.
Figure 2B:
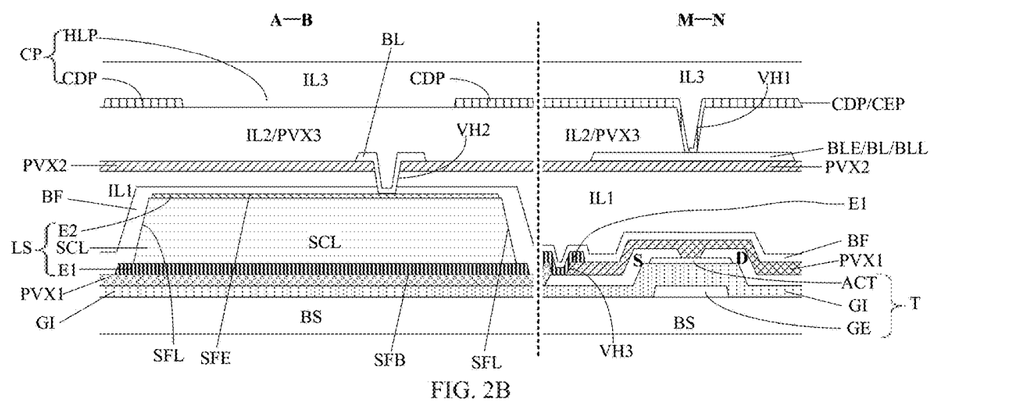
FIG. 2B is a first cross-sectional schematic diagram along a line A-B and a line M-N in FIG. 2A.
Figure 2C:
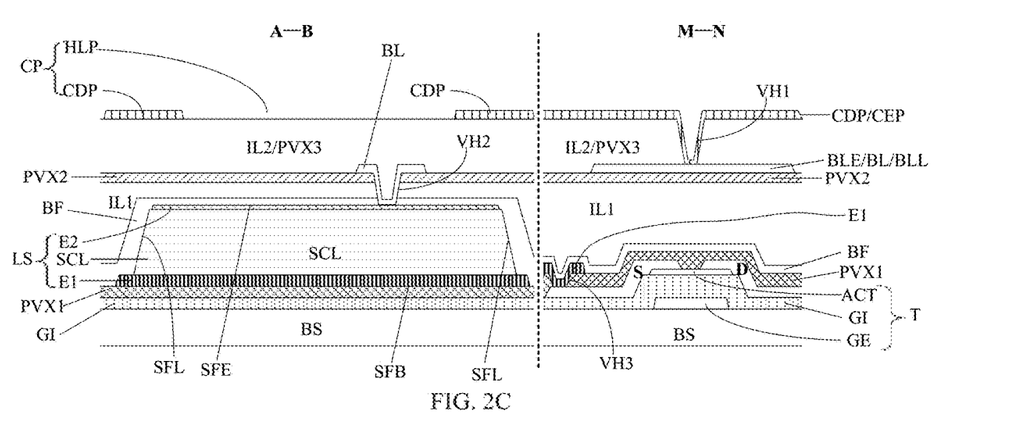
FIG. 2C is a second cross-sectional schematic diagram along a line A-B and a line M-N in FIG. 2A.
Figure 3A:
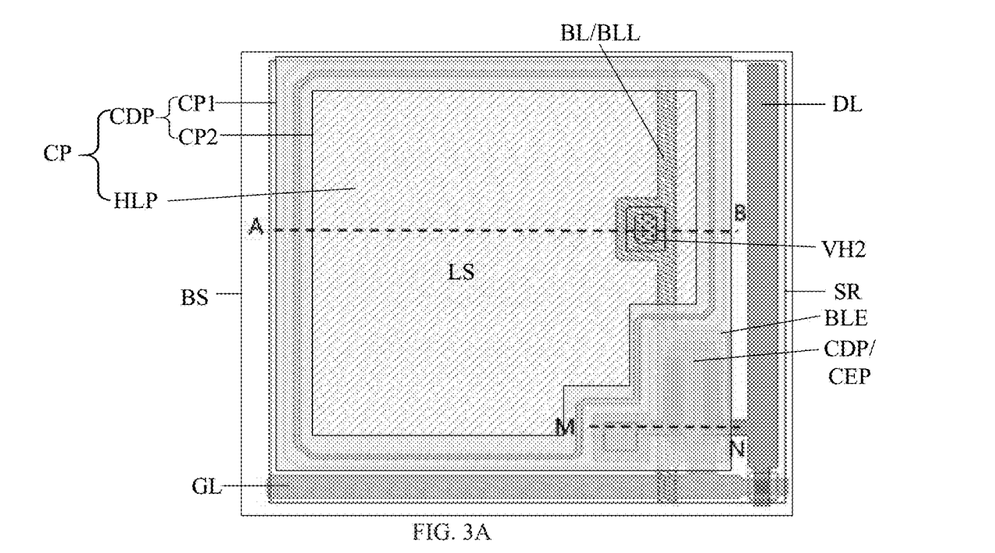
FIG. 3A is a second partial top-view schematic diagram of a sensing substrate provided by an embodiment of the present disclosure.
Figure 3B:
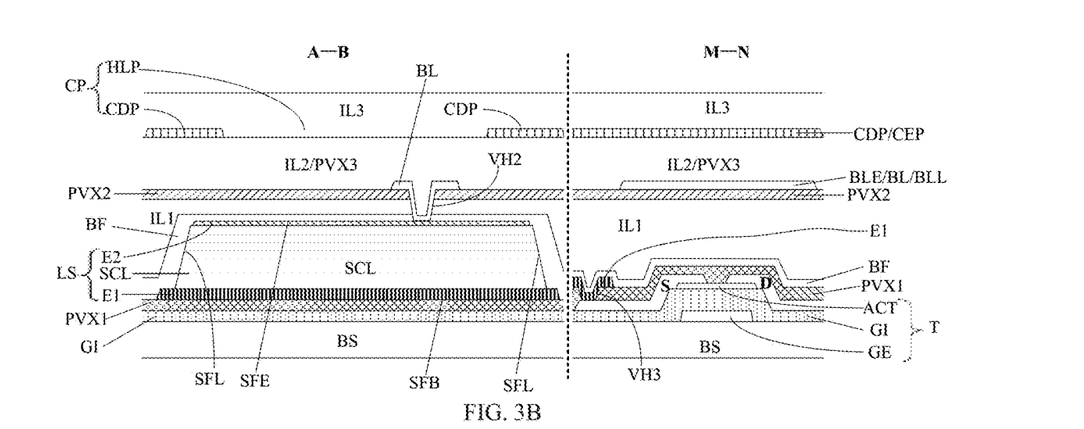
FIG. 3B is a first cross-sectional schematic diagram along a line A-B and a line M-N in FIG. 3A.
Figure 3C:
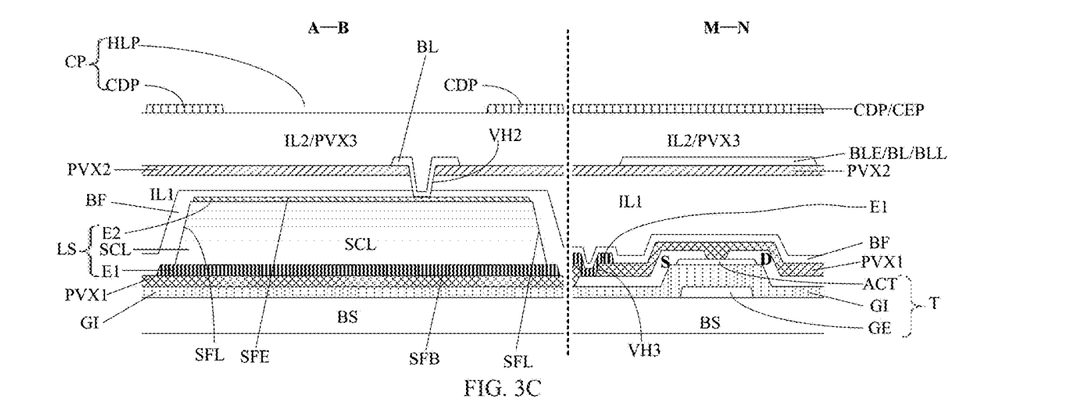
FIG. 3C is a second cross-sectional schematic diagram along a line A-B and a line M-N in FIG. 3A.

FIG. 2A is a first partial top-view schematic diagram of a sensing substrate provided by an embodiment of the present disclosure, FIG. 2B is a first cross-sectional schematic diagram along a line A-B and a line M-N in FIG. 2A, FIG. 2C is a second cross-sectional schematic diagram along a line A-B and a line M-N in FIG. 2A, FIG. 3A is a second partial top-view schematic diagram of a sensing substrate provided by an embodiment of the present disclosure, FIG. 3B is a first cross-sectional schematic diagram along a line A-B and a line M-N in FIG. 3A, and FIG. 3C is a second cross-sectional schematic diagram along a line A-B and a line M-N in FIG. 3A.

As shown in FIGS. 2A to 4, an embodiment of the present disclosure provides a sensing substrate, which includes a base substrate BS and a first insulating layer IL1 on the base substrate BS. The sensing substrate further includes a sensing unit located on the base substrate BS, and the sensing unit includes a sensing element LS, the sensing element LS is located on the side of the first insulating layer IL1 facing the base substrate BS, that is, the sensing element LS is located between the first insulating layer IL1 and the base substrate BS in a direction perpendicular to the base substrate BS, the sensing element LS has a light incident surface SFE and a back surface SFB that are opposite to each other and a side surface SFL between the light incident surface SFE and the back surface SFB, the light incident surface SFE is located on the side of the back surface SFB away from the base substrate BS, that is, the back surface SFB is located between the light incident surface SFE and the base substrate BS in the direction perpendicular to the base substrate BS.

The sensing unit further includes a conductive pattern CP, and the conductive pattern CP is located on the side of the first insulating layer IL1 away from the base substrate BS, that is, the first insulating layer IL1 is located between the conductive pattern CP and the base substrate BS in the direction perpendicular to the base substrate BS, and in this case, the conductive pattern CP is located on the side of the sensing element LS away from the base substrate B S. The conductive pattern CP has a hollow portion HLP and a transparent conductive portion CDP surrounding the hollow portion HLP, and the hollow portion HLP is an opening penetrating through the transparent conductive portion CDP, that is, the orthographic projection of the conductive pattern CP on the base substrate BS includes an outer edge CP1 and an inner edge CP2 located inside the outer edge, the orthographic projection of the hollow portion HLP on the base substrate BS is a region enclosed by the inner edge CP2, and the orthographic projection of the transparent conductive portion CDP on the base substrate BS is a region between the inner edge CP2 and the outer edge CP1. The orthographic projection of the hollow portion HLP on the base substrate BS is at least partially within the orthographic projection of the sensing element LS on the base substrate BS, and the orthographic projection of the transparent conductive portion CDP on the base substrate BS at least partially overlaps with the orthographic projection of the side surface SFL of the sensing element LS on the base substrate B S.

For example, as shown in FIG. 2A and FIG. 3A, the orthographic projection of the transparent conductive portion CDP on the base substrate BS overlaps with the orthographic projection of the entire side surface SFL of the sensing element LS on the base substrate BS. That is, the orthographic projection of the side surface SFL on the base substrate BS is located within the orthographic projection of the transparent conductive portion CDP on the base substrate B S.

In the embodiments of the present disclosure, the conductive pattern CP is provided on the side of the first insulating layer IL1 away from the base substrate BS, and the orthographic projection of the transparent conductive portion CDP of the conductive pattern CP on the base substrate BS at least partially overlaps with the orthographic projection of the side surface SFL of the sensing element LS on the base substrate BS, and therefore the transparent conductive portion CDP of the conductive pattern CP can shield the influence of static electricity on the electric field of the sensing element LS in the lower layer. This design can theoretically play a good electrostatic shielding effect on the processes (such as water washing, handling and touching by a person, electrostatic discharge caused by poor grounding of equipment, etc.) that may cause static electricity residues in the manufacturing process of the sensing substrate, and can also play a role in electrostatic protection for the back-end process (such as attaching an OCA (optical clear adhesive) layer, absorbing and pick-and-placing the suction plate, etc.) after the sensing substrate is manufactured, and finally, the probability of occurrence of static Mura and image unevenness is significantly reduced, and the product yield is improved; at the same time, the design basically does not affect the photoelectric response sensitivity of the sensing substrate. On the other hand, the conductive pattern CP can also facilitate dissipation of locally generated static electricity. On the other hand, by making the conductive pattern CP have the hollow portion HLP, the orthographic projection of the hollow portion HLP and the orthographic projection of the light incident surface SFE of the sensing element LS on the base substrate BS at least partially overlap with each other, the transmittance of the conductive pattern CP to light (especially visible light) can be improved, so that more light is sensed by the sensing element LS. In addition, in the subsequent process, resin needs to be coated on the sensing substrate and a scintillator material such as cesium iodide is evaporated on the sensing substrate. Because the conductive pattern CP in the embodiments of the present disclosure has the hollow portion HLP, the bonding force between the sensing substrate in the embodiments of the present disclosure and the resin layer or the scintillator material such as cesium iodide is relatively good. For example, when the area of the conductive pattern CP is large, the bonding force between the sensing substrate and the resin layer or the cesium iodide layer may be poor, in this case, the above-mentioned patterned design of the conductive pattern CP (e.g., the hollow design) can reduce the coverage area of the conductive pattern CP on the sensing substrate, thus improving the bonding force between the sensing substrate and the resin layer or the scintillator materials such as cesium iodide while ensuring the anti-static effect.

In at least one embodiment, the sensing element LS may be a photoelectric detection element, such as a photodiode or the like. For example, as shown in FIGS. 2B-2C and FIGS. 3B-3C, the sensing element LS includes a first electrode E1 and a second electrode E2 arranged oppositely, and the first electrode E1 is located between the second electrode E2 and the base substrate BS in the direction perpendicular to the base substrate BS, the above-mentioned light incident surface SFE of the sensing element LS is the surface of the second electrode E2 away from the base substrate BS, and the second electrode E2 is a transparent electrode. For example, the material of the second electrode E2 may be a transparent conductive oxide, such as ITO (Indium Tin Oxide), IZO (Indium Zinc Oxide), IGZO (Indium Gallium Zinc Oxide), or the like. For example, the material of the first electrode E1 may be a metal or transparent conductive oxide or the like. The sensing element LS further includes a semiconductor layer SCL between the first electrode E1 and the second electrode E2 in the direction perpendicular to the base substrate BS, the side surface SFL of the sensing element LS includes the side surface of the semiconductor layer SCL, the angle between the side surface of the semiconductor layer SCL and the surface of the base substrate BS is, for example, 70°-90°, such as about 80°, and the orthographic projection of the side surface of the semiconductor layer SCL on the base substrate BS at least partially overlaps with the orthographic projection of the transparent conductive portion CDP on the base substrate BS, for example, the entire orthographic projection of the side surface of the semiconductor layer SCL on the base substrate BS overlaps with the orthographic projection of the transparent conductive portion CDP on the base substrate BS. For example, the semiconductor layer SCL is a PIN-type semiconductor layer, that is, the semiconductor layer SCL includes a P-type semiconductor layer, an intrinsic semiconductor layer, and an N-type semiconductor layer that are stacked in sequence. In other embodiments, the sensing element LS may also be other types of detection elements.

Figure 4:
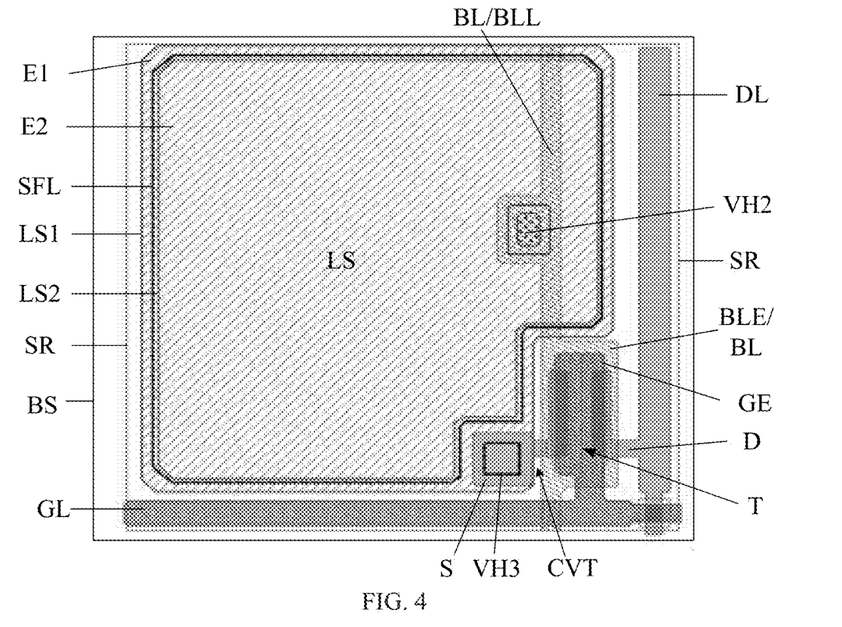
FIG. 4 is a schematic top-view of a portion of the structure in FIGS. 2A and 3A.

In FIG. 4, LS1 represents the orthographic projection of the edge of the first electrode E1 on the base substrate BS, LS2 represents the orthographic projection of the edge of the second electrode E2 on the base substrate BS, the region enclosed by LS2 represents the orthographic projection of the light incident surface of the sensing element LS on the base substrate BS. For example, as shown in FIGS. 2A, 3A, and 4, the conductive pattern CP shields the orthographic projection LS2 of the edge of the second electrode E2 on the base substrate BS, so that a better shielding effect can be achieved.

For example, in some cases, in an actual product, for example, the second electrode E2 does not shield the side surface of the semiconductor layer SCL. In this case, the orthographic projection of the side surface SFL of the semiconductor layer SCL on the base substrate BS is located outside the orthographic projection of the second electrode E2 on the base substrate BS.

For example, in other cases, in an actual product, for example, the second electrode E2 does not cover the entire upper surface of the semiconductor layer SCL, and the upper surface is the surface of the semiconductor layer SCL away from the base substrate BS. For example, as shown in FIGS. 2B-2C and FIGS. 3B-3C, the upper surface of the semiconductor layer SCL has a portion beyond the second electrode E2, and the orthographic projection of the portion beyond the second electrode E2 on the base substrate BS is located outside the orthographic projection of the lower surface of the second electrode E2 (the surface of the second electrode E2 facing the base substrate BS) on the base substrate BS.

In at least one embodiment, the material of the transparent conductive portion CDP of the conductive pattern CP may be a transparent conductive oxide, such as one or more selected form a group consisting of ITO (Indium Tin Oxide), IZO (Indium Zinc Oxide), and IGZO (Indium Gallium Zinc Oxide). That is, the layer where the transparent conductive pattern CP is located is at least one or more selected form a group consisting of the ITO layer, the IZO layer, and the IGZO layer.

In at least one embodiment, as shown in FIG. 2A and FIG. 3A, the orthographic projection of the transparent conductive portion CDP on the base substrate BS is in a closed frame structure. This is beneficial for the transparent conductive portion CDP to shield more portions of the side surface SFL of the sensing element LS to improve the shielding effect. In other embodiments, the orthographic projection of the transparent conductive portion CDP on the base substrate BS may also be non-closed.

For example, as shown in FIG. 2A and FIG. 3A, the transparent conductive portion CDP having the frame-shaped structure includes a plurality of strip-shaped extension portions, for example, at least includes two extension portions extending in a first direction (a vertical direction in FIG. 2A and FIG. 3A) and opposite in a second direction (a horizontal direction in FIG. 2A and FIG. 3A), and two extension portions extending in the second direction and opposite in the first direction. Considering the process etch margin, in order to prevent the extension portion from being too thin to affect the resistance, for example, each extension portion includes an inner portion that overlaps with the sensing element LS and an outer portion that does not overlap with the sensing element LS. For example, in the arrangement direction of the inner portion and the outer portion, the width of the inner portion is larger than the width of the outer portion. For example, in the arrangement direction of the inner portion and the outer portion, the width of the inner portion is approximately 6 µm~8 µm, e.g., 7.15 µm, and the width of the outer portion is approximately 2 µm~3 µm, e.g., 2.65 µm, so that the overall width of the extension portion is approximately 8 µm~11 µm, e.g., 9.8 µm.

For example, the inner edge CP2 of the orthographic projection of the conductive pattern CP on the base substrate BS is parallel to the edge LS1 or LS2 of the orthographic projection of the sensing element LS on the base substrate BS, the distances between the respective positions of the inner edge CP2 of the orthographic projection of the conductive pattern CP on the base substrate BS and the edge LS1 or LS2 of the orthographic projection of the sensing element LS on the base substrate BS are substantially equal.

For example, the conductive pattern CP is located in the pixel region defined by the intersection of the data line DL and the gate line GL, and the orthographic projection of the conductive pattern CP on the base substrate BS do not overlap with the orthographic projections of the data line DL and the gate line GL on the base substrate BS.

In at least one embodiment, as shown in FIGS. 2A to 4, the sensing unit included in the sensing substrate further includes a switching element T (not marked in FIG. 2A and FIG. 3A) located on the base substrate BS, the switching element T is electrically connected to the sensing element LS, and is used for controlling the output of the electrical signal of the sensing element LS, and the orthographic projection of the switching element T on the base substrate BS is located outside the orthographic projection of the light incident surface SFE of the sensing element LS on the base substrate BS. For example, in other embodiments, the orthographic projection of the switching element T on the base substrate BS may also at least partially overlap with the orthographic projection of the sensing element LS on the base substrate BS, for example, the orthographic projection of the switching element T on the base substrate BS is located within the orthographic projection of the sensing element LS on the base substrate BS.

In at least one embodiment, as shown in FIGS. 2A to 3C, the conductive pattern CP extends to the position where the switching element T is located, so that the transparent conductive portion CDP of the conductive pattern CP has a larger area and thus has a smaller resistance. That is, the orthographic projection of the conductive pattern CP on the base substrate BS overlaps with the orthographic projection of at least a portion of the switching element T on the base substrate BS. For example, the orthographic projection of the conductive pattern CP on the base substrate BS overlaps with the orthographic projection of the bias line excess portion BLE (that is, the portion of the bias signal line BL that shields the switching element T) of the bias signal line BL on the base substrate BS, and the orthographic projection of the conductive pattern CP on the base substrate BS overlaps with the outer boundary of the bias line excess portion BLE or is located slightly inside the outer boundary of the bias line excess portion BLE, so as to avoid forming an additional overlapping capacitor with the underlying metal.

For example, as shown in FIG. 2A and FIG. 3A, the switching element T is located in the region surrounded by the sensing element LS and the data line DL and the gate line GL that are adjacent to the sensing element LS, and the transparent conductive part CDP of the conductive pattern CP extends into this region. In at least one embodiment, the transparent conductive portion CDP does not overlap with the data line DL and the gate line GL to avoid generating a parasitic capacitor. For example, the distance between the orthographic projection of the transparent conductive portion CDP and the orthographic projection of the data line DL on the base substrate BS is approximately 4 µm to 5 µm, such as 4.35 µm, which basically does not affect the parasitic capacitor of the data line DL, thereby avoiding increasing noise. For example, the distance between the transparent conductive portion CDP and the gate line GL is about 1 µm-2 µm, e.g., 1.25 µm. For example, the distance between the sensing element LS and the data line DL is greater than the distance between the sensing element LS and the gate line GL, because the parasitic capacitor generated by the data line DL will affect the image noise, increasing the distance between the sensing element LS and the data line DL can reduce the parasitic capacitor. Correspondingly, the distance between the transparent conductive portion CDP and the data line DL is greater than the distance between the transparent conductive portion CDP and the gate line GL.

For example, the switching element T may be a transistor (e.g., a thin film transistor) or other types of switching devices. For example, the thin film transistor may be various forms of thin film transistors, such as an amorphous silicon thin film transistor, an oxide thin film transistor, or a LTPS thin film transistor. Taking the switching element T as a transistor as an example, as shown in FIGS. 2A to 4, the switching element T includes a gate electrode GE, an active layer ACT, and a source electrode S and a drain electrode D that are electrically connected to the active layer ACT. For example, the source electrode S is electrically connected to the sensing element LS to receive an electrical signal output by the sensing element LS, and the electrical signal is output to the data line DL through the drain electrode D (as shown in FIG. 2A, FIG. 3A, and FIG. 4).

For example, the source electrode S and the drain electrode D of the switching element T are located in the same layer (i.e., formed by the same thin film) to save processes. For example, the source electrode S of the switching element T and the first electrode E1 of the sensing element LS may be located in the same layer or in different layers (i.e., formed by different thin films). In the embodiments of the present disclosure, for example, a first passivation insulating layer PVX1 is also formed on the base substrate BS after the layer where the source electrode S and the drain electrode D are located are formed on the base substrate BS; for example, the first passivation insulating layer PVX1 may be an inorganic insulating layer, the inorganic insulating layer includes a layer formed by stacking one or more of silicon oxide, silicon nitride, and silicon oxynitride; in some examples, the first passivation insulating layer PVX1 may also be an organic insulating layer, or may also be a multilayer structure comprising an inorganic insulating layer, an organic insulating layer, and an inorganic insulating layer that are stacked, so as to prevent the sensing element LS from affecting the switching element T, and better ensure the performance of the switching element T. If the source electrode S and the first electrode E1 are located in the same layer, the material of the first passivation insulating layer PVX1 on the first electrode E1 needs to be etched away, which will cause the surface of the first electrode E1 to be relatively rough, thereby affecting the performance of the semiconductor layer SCL and thus affecting the performance of the sensing element LS. Therefore, an alternative method is that the source electrode S of the switching element T and the first electrode E1 of the sensing element LS are located in different layers. For example, as shown in FIGS. 2B-2C and FIGS. 3B-3C, the source electrode S of the switching element T and the first electrode E1 of the sensing element LS are located in different layers, and the first electrode E1 is electrically connected to the source electrode S through the hole VH3 penetrating the first passivation insulating layer PVX1, and a portion, located at the hole VH3, of the first electrode E1 is located on the side of the source electrode S away from the base substrate BS.

In at least one embodiment, in order to avoid the switching element T, the orthographic projection of the sensing element LS on the base substrate BS is recessed toward the center of the sensing element LS to form a notch (hereinafter referred to as a concave portion) that accommodates at least a portion of the switching element T. For example, as shown in FIG. 4, the orthographic projection of the light incident surface SFE of the sensing element LS on the base substrate BS has a concave portion CVT. In at least one embodiment, the conductive pattern CP may extend into the concave portion CVT to have a larger area. For example, as shown in FIGS. 2A to 3C, the conductive pattern CP includes a conductive pattern expansion portion CEP beyond the light incident surface SFE of the sensing element LS; as shown in FIG. 2A and FIG. 3A, the concave portion (not marked in the figure) accommodates an orthographic projection of at least a portion of the conductive pattern expansion portion CEP on the base substrate BS.

In at least one embodiment, the conductive pattern CP is configured to be applied with a fixed voltage when the sensing element LS operates. For example, the conductive pattern CP is electrically connected to a structure, such as a bias signal line, on the sensing substrate that can provide a fixed voltage, so as to apply a fixed voltage to the conductive pattern CP through the structure to prevent the conductive pattern CP from being in a floating state.

For example, as shown in FIGS. 2A to 4, the sensing substrate further includes a bias line layer BLL located on the base substrate BS, and the bias line layer BLL includes a bias signal line BL; the bias signal line BL is electrically connected to the sensing element LS, for example, the bias signal line BL is electrically connected to the sensing element LS through the hole VH2 to provide the sensing element LS with a bias voltage, and the bias voltage is to set the sensing element LS in a biased state. For example, the bias signal line BL can be made of a material such as a metal.

In at least one embodiment, as shown in FIG. 2A and FIG. 3A, the bias signal line BL includes a bias line excess portion BLE beyond the light incident surface SFE of the sensing element LS; the bias line excess portion BLE shields at least a portion of the switching element TFT, that is, the orthographic projection of the switching element T on the base substrate BS is at least partially within the orthographic projection of the bias line excess portion BLE on the base substrate BS, so as to prevent the switching element T from being affected by light.

In at least one embodiment, the bias signal line BL is electrically connected to the conductive pattern CP, for example, the bias line excess portion BLE of the bias signal line BL is electrically connected to the conductive pattern CP. By electrically connecting the conductive pattern CP with the bias signal line BL, the bias voltage of the conductive pattern CP and the bias voltage of the second electrode E2 of the sensing element LS can have the equal potential, which can avoid generating an additional capacitor between the second electrode E2 and the conductive pattern CP.

In at least one embodiment, as shown in FIGS. 2B-2C and FIGS. 3B-3C, the sensing substrate includes a second insulating layer IL2 on the base substrate B S, and the second insulating layer IL2 is located between the bias signal line BL and the conductive pattern CP in the direction perpendicular to the base substrate BS. It should be noted that, the embodiments shown in FIGS. 2B-2C and FIGS. 3B-3C are described by taking a case that the bias signal line BL is located on the side of the second insulating layer IL2 facing the base substrate BS and the conductive pattern CP is located on the side of the second insulating layer IL2 away from the base substrate BS as an example, in this case, the second insulating layer IL2 is located on the side of the first insulating layer IL1 away from the base substrate BS. In other embodiments, the positions of the bias signal line BL and the conductive pattern CP can be interchanged, in this case, for example, the second insulating layer IL2 and the first insulating layer IL1 are the same insulating layer.

In some embodiments, the electrical connection between the bias signal line BL and the conductive pattern CP may be achieved through a hole disposed near the sensing element LS; alternatively, both the bias signal line BL and the conductive pattern CP may be electrically connected to a conductive structure in the frame region of the sensing substrate, so as to achieve electrical connection through the conductive structure.

In at least one embodiment, as shown in FIGS. 2B-2C, the bias signal line BL is electrically connected to the conductive pattern CP through a hole VH1 penetrating the second insulating layer IL2. For example, the conductive pattern expansion portion CEP is filled into the hole VH1 to be electrically connected to the bias line excess portion BLE. For example, the orthographic projection of the hole VH1 on the base substrate BS is located within the orthographic projection of the switching element T on the base substrate BS. In the embodiments of the present disclosure, the position where the conductive pattern CP is electrically connected to the bias signal line BL is located in the region SR where the sensing unit including the conductive pattern CP is located, which is beneficial to reduce the voltage drop.

In at least another embodiment, the conductive pattern CP and the bias signal line BL may be electrically connected not through the hole VH1. For example, as shown in FIGS. 3B-3C, in the region SR where the sensing unit including the conductive pattern CP is located, the entire conductive pattern CP is separated from the bias signal line BL by the second insulating layer IL2. That is to say, in the region SR where the sensing unit including the conductive pattern CP is located, the conductive pattern CP and the bias signal line BL are electrically connected not through the hole VH1, but the entire surface of the conductive pattern CP facing the bias signal line BL and the entire surface of the bias signal line BL facing the conductive pattern CP are parallel to each other.

Figure 5A:
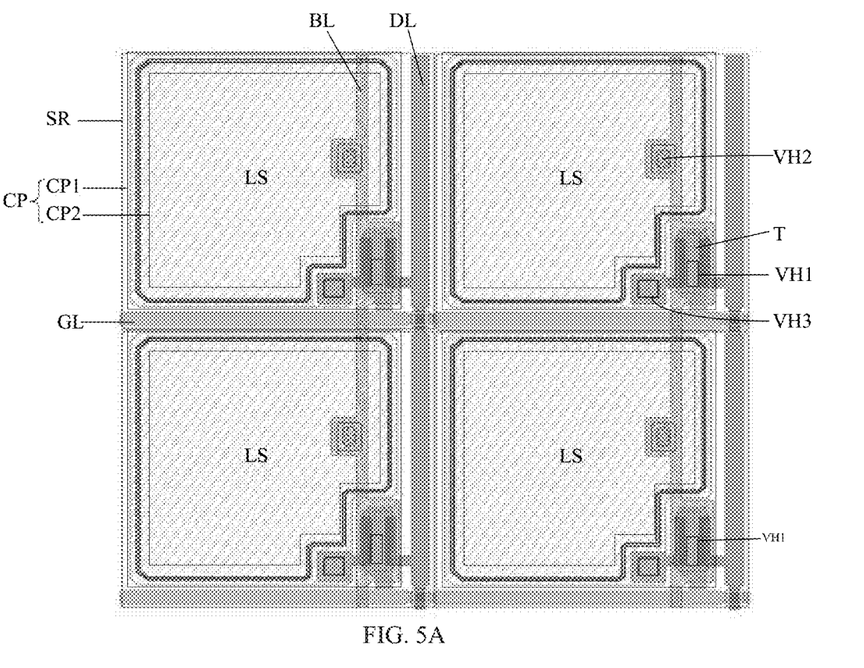
FIG. 5A is a first top-view schematic diagram of four sensing units in a sensing substrate provided by an embodiment of the present disclosure.
Figure 5B:
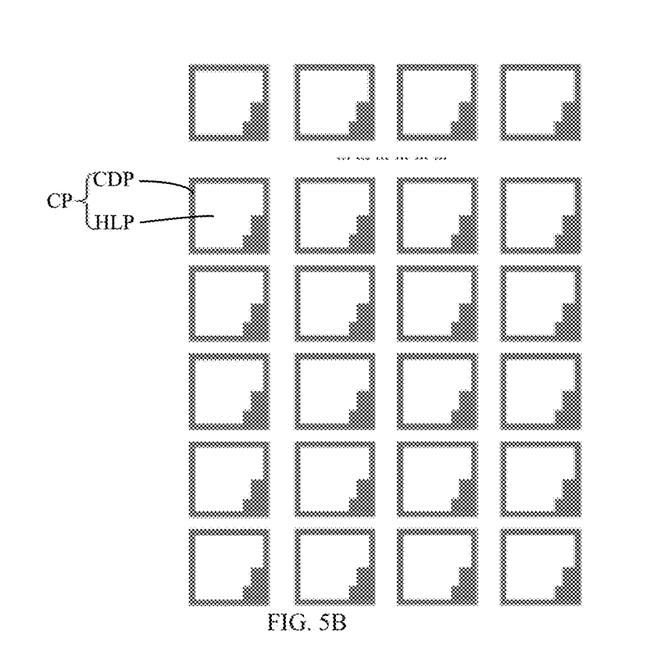
FIG. 5B is a top-view schematic diagram showing a case that conductive patterns in the sensing substrate provided by an embodiment of the present disclosure are independent of each other.

FIG. 5A is a first top-view schematic diagram of four sensing units in a sensing substrate provided by an embodiment of the present disclosure; and FIG. 5B is a top-view schematic diagram showing a case that conductive patterns in the sensing substrate provided by an embodiment of the present disclosure are independent of each other. For example, as shown in FIG. 5A, the sensing substrate includes a plurality of sensing units spaced apart from each other (four sensing units are shown in the figure, and the region where each sensing unit is located is denoted by SR). In the case where the electrical connection position of the conductive pattern CP and the bias signal line BL is located in the region SR where the sensing unit including the conductive pattern CP is located (that is, the conductive pattern CP and the bias signal line BL are electrically connected together through the hole VH1), as shown in FIG. 5A and FIG. 5B, the conductive patterns CP included in the plurality of sensing units are independent of each other, that is, the orthographic projections of the conductive patterns CP included in the plurality of sensing units on the base substrate BS are isolated from each other and are not connected together, so that the orthographic projection of the transparent conductive layer where the conductive patterns CP are located on the base substrate BS does not overlap with the orthographic projections of the gate line GL and the data line DL on the base substrate BS.

In the case where the entire conductive pattern CP is separated from the bias line layer BLL by the second insulating layer IL2, a fixed voltage may be supplied to the conductive pattern CP in the following method: the conductive patterns CP of the plurality of sensing units on the sensing substrate are electrically connected to each other, and the conductive pattern CP included in the sensing unit located on the outermost side is electrically connected to a signal line capable of providing a fixed voltage in the frame region.

Figure 6A:
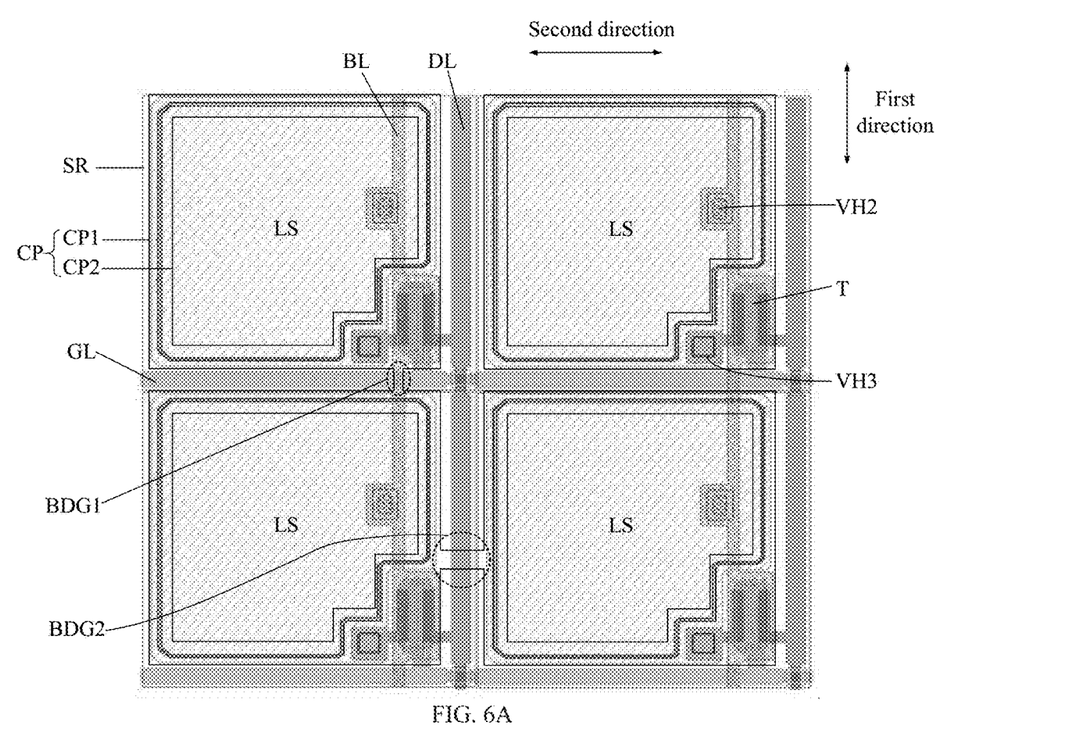
FIG. 6A is a second top-view schematic diagram of four sensing units in a sensing substrate provided by an embodiment of the present disclosure.
Figure 6B:
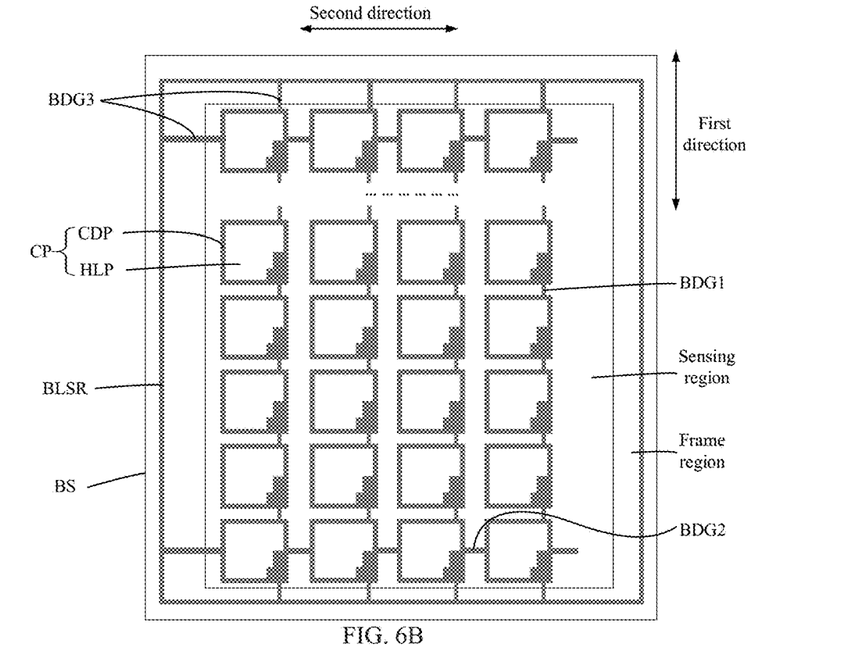
FIG. 6B is a top-view schematic diagram showing a case that conductive patterns in the sensing substrate provided by an embodiment of the present disclosure are connected to each other.

FIG. 6A is a second top-view schematic diagram of four sensing units in a sensing substrate provided by an embodiment of the present disclosure; and FIG. 6B is a top-view schematic diagram showing a case that conductive patterns in the sensing substrate provided by an embodiment of the present disclosure are connected to each other.

In at least one embodiment, as shown in FIG. 6A, in the case where the entire conductive pattern CP is separated from the bias signal line BL by the second insulating layer IL2, the sensing substrate includes a plurality of sensing units spaced apart from each other, and includes a plurality of first conductive bridges BDG1 spaced apart from each other and a plurality of second conductive bridges BDG2 spaced apart from each other on the base substrate BS (only one first conductive bridge BDG1 and one second conductive bridge BDG2 are shown in FIG. 6A for illustration); each first conductive bridge BDG1 extends along the first direction and electrically connects the conductive patterns CP of adjacent sensing units in the first direction, and each second conductive bridge BDG2 extends along the second direction and electrically connects the conductive patterns of adjacent sensing units in the second direction, and the second direction is different from the first direction. For example, the line width of the first conductive bridge BDG1 and the line width of the second conductive bridge BDG2 are 8 μm-12 μm, such as about 10 μm, to ensure the reliability of the electrical connection.

In at least one embodiment, as shown in FIG. 6B, the conductive patterns CP included in the plurality of sensing units of the sensing substrate may be arranged in a plurality of conductive pattern columns, a plurality of first conductive pattern rows, and a plurality of second conductive pattern rows. In FIG. 6B, taking a case where the extending direction of the conductive pattern column is the first direction and the extending direction of the conductive pattern row is the second direction as an example for illustration. The adjacent conductive patterns CP in the same conductive pattern column are connected together by the first conductive bridge BDG1, for example, the first conductive bridge BDG1 is directly connected with the conductive patterns CP (for example, in the same layer) adjacent to the first conductive bridge BDG1 to simplify the process; the adjacent conductive patterns CP in the same first conductive pattern row are connected together by the second conductive bridge BDG2, for example, the second conductive bridge BDG2 is directly connected with the conductive patterns CP (for example, in the same layer) adjacent to the second conductive bridge BDG2 to simplify the process; the adjacent conductive patterns CP in the same second conductive pattern row are independent of each other, that is, the adjacent conductive patterns in the same second conductive pattern row are disconnected from each other and not directly connected; the plurality of first conductive pattern rows and the plurality of second conductive pattern rows are alternately arranged.

It should be noted that the plurality of first conductive pattern rows and the plurality of second conductive pattern rows being alternately arranged means that there are one or more second conductive pattern rows between adjacent first conductive pattern rows.

For example, adjacent first conductive pattern rows are spaced apart at a certain cycle. For example, the cycle may be 2 to ½ the number of the gate lines. For example, in some embodiments, the cycle is 6, that is, in the extending direction of the data line DL, one first conductive pattern row and five second conductive pattern rows are regarded as one cycle, so that five second conductive pattern rows are between adjacent first conductive pattern rows. Or, in other embodiments, the cycle is 64, that is, in the extending direction of the data line DL, one first conductive pattern row and 63 second conductive pattern rows are regarded as one cycle, so that 63 second conductive pattern rows are between adjacent first conductive pattern rows.

When the conductive pattern CP is powered on and operates, because the first conductive bridge BDG1 crosses the gate line GL and the second conductive bridge BDG2 crosses the data line DL, the overlapping capacitors will be generated to cause noise, especially the overlapping between the second conductive bridge BDG2 and the data line DL has a greater influence on product characteristics. Therefore, the conductive patterns CP adjacent in the extending direction of the data line DL (i.e., the first direction) are connected by the first conductive bridge BDG1, while the conductive patterns CP adjacent in the extending direction of the gate line GL are connected by the second conductive bridge BDG2, and the first conductive pattern rows and the second conductive pattern rows are alternately and periodically arranged. On one hand, this design can prevent the poor signal transmission caused by the disconnection of the conductive bridge from affecting the electrostatic shielding effect. On the other hand, this design can reduce the resistivity and compensate the voltage of the bias signal line BL to a certain extent, so that the voltage of the bias signal line BL does not attenuate with the resistance of the conductive pattern CP.

In at least one embodiment, as shown in FIG. 6A, the bias line layer includes a plurality of bias signal lines BL spaced apart from each other, and the orthographic projection of each bias signal line BL on the base substrate BS overlaps with the orthographic projections of the first conductive bridges BDG1 sequentially arranged along the first direction on the base substrate BS, for example, the orthographic projection of each bias signal line BL on the base substrate BS completely overlaps with the orthographic projections of the first conductive bridges BDG1 sequentially arranged along the first direction on the base substrate BS to avoid generating the additional capacitor. For example, the line widths of the portions of the respective bias signal lines BL overlapped with the first conductive bridge BDG1 are substantially the same. By making the first conductive bridge BDG1 overlap with the bias signal line BL, it is possible to avoid the additional overlapping capacitor, and it is beneficial to prevent the first conductive bridge BDG1 from affecting the transmittance.

In at least one embodiment, as shown in FIG. 6B, the sensing substrate includes a sensing region and a frame region surrounding the sensing region; in the frame region, the sensing substrate includes a bias short-circuit ring BLSR on the base substrate BS, the bias short-circuit ring BLSR is located in the frame region and is in a ring structure or a semi-ring structure surrounding the sensing region, the bias short-circuit ring BLSR connects opposite two ends of the same bias signal line BL in the extending direction thereof, so that both the two ends of the bias signal line BL can receive the bias voltage. As shown in FIG. 6B, the sensing substrate further includes a plurality of third conductive bridges BDG3 located in the frame region and spaced apart from each other, and the bias short-circuit ring BLSR is electrically connected to the conductive patterns CP of the sensing units (i.e., the sensing units located on the outermost side) immediately adjacent to the bias short-circuit ring BLSR through the plurality of third conductive bridges BDG3, respectively.

In other embodiments, the conductive pattern CP may also be electrically connected to the bias short-circuit ring BLSR through other conductive structures, or the conductive pattern CP may also be electrically connected to a signal line, other than the bias short-circuit ring BLSR, capable of providing a fixed voltage.

In the embodiment shown in FIGS. 6A-6B, in order to simplify the manufacturing process, the conductive patterns CP, the first conductive bridges BDG1 to the third conductive bridges BDG3 may be located in the same layer (i.e., formed by the same thin film).

Compared with the embodiment shown in FIGS. 6A-6B, in the embodiment shown in FIGS. 5A-5B, because the position where the conductive pattern CP is electrically connected to the bias signal line BL (i.e., the position of the hole VH1) is located in the region SR where the sensing unit including the conductive pattern CP is located, the conductive patterns CP are independent of each other, which can reduce the voltage drop; in addition, compared with the embodiment shown in FIGS. 6A-6B, the embodiment shown in FIGS. 5A-5B does not need to provide the bias short-circuit ring BLSR in the frame region.

It should be noted that, in the embodiments shown in FIG. 5B and FIG. 6B, the transparent conductive layer where the conductive patterns CP are located has a grid-shaped grid structure, that is, the plurality of conductive patterns CP included in the transparent conductive layer are frame-shaped structures spaced apart from each other, and these conductive patterns CP may be independent of each other (as shown in FIG. 5B) or connected to each other by the conductive bridges (as shown in FIG. 6B). In at least another embodiment, the transparent conductive layer may also have a strip-shaped grid structure, that is, the transparent conductive layer includes a plurality of first extension strips extending along the first direction and sequentially arranged along the second direction, and a plurality of second extension strips extending along the second direction and sequentially arranged along the first direction, and a frame-shaped structure surrounded by two adjacent first extension strips and two adjacent second extension strips is a conductive pattern. Compared with the strip-shaped grid structure, the shielding effect of the grid-shaped grid structure is better. In the embodiments of the present disclosure, the transparent conductive layer where the conductive pattern CP is located may also adopt other patterns that do not block the photosensitive region of the pixels as much as possible except for the grid-shaped grid structure and the strip-shaped grid structure.

In at least one embodiment, the conductive pattern CP and the original transparent conductive structure of the sensing substrate can be formed using the same thin film, so as to avoid an additional transparent conductive layer.

Figure 7:
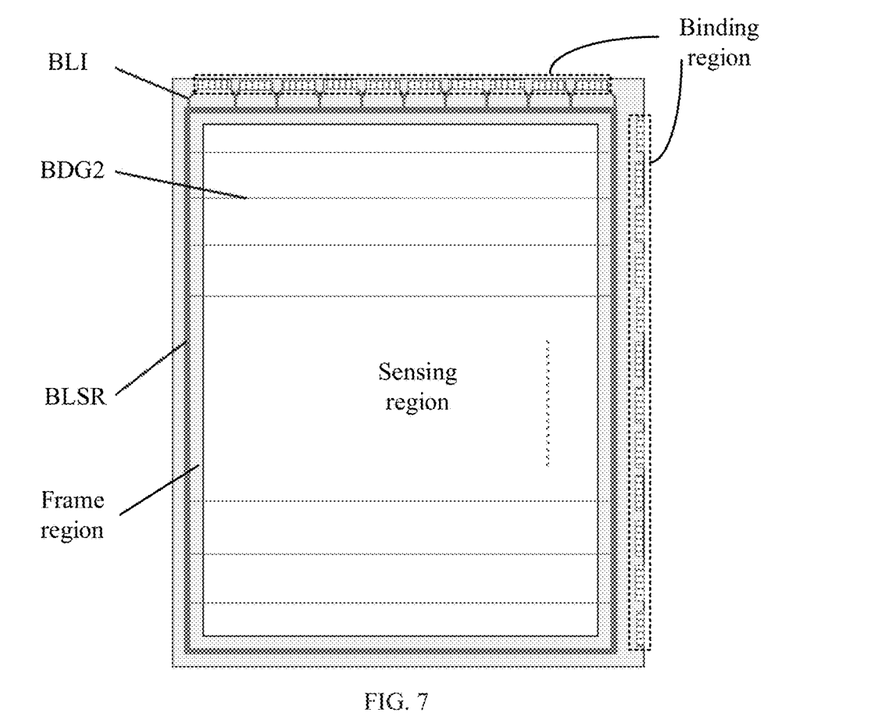
FIG. 7 is a simplified top-view schematic diagram of a sensing substrate provided by an embodiment of the present disclosure.
Figure 8:
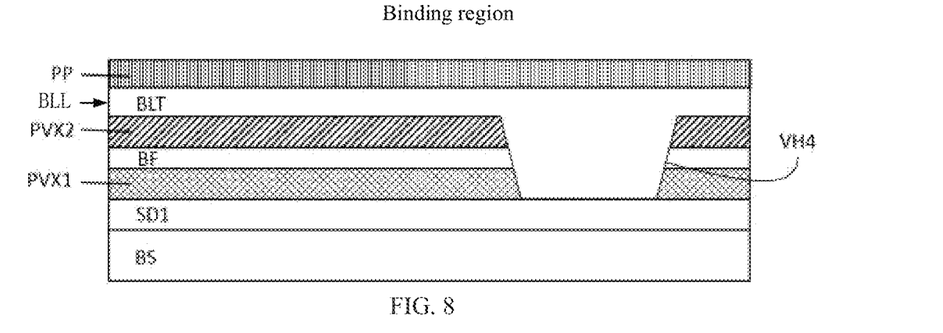
FIG. 8 is a partial cross-sectional schematic diagram of a binding region of a sensing substrate provided by an embodiment of the present disclosure.

FIG. 7 is a simplified top-view schematic diagram of a sensing substrate provided by an embodiment of the present disclosure; and FIG. 8 is a partial cross-sectional schematic diagram of a binding region of a sensing substrate provided by an embodiment of the present disclosure.

For example, as shown in FIG. 7, the sensing substrate includes a binding region, and the binding region is located in the frame region. In the case where the sensing substrate includes the bias short-circuit ring BLSR, for example, the binding region is located outside the bias short-circuit ring BLSR, and the bias short-circuit ring BLSR is electrically connected to the binding region through a bias signal input line BLI, the bias signal input line BLI and the bias signal line BL are connected and are located in the same layer. It should be noted that, FIG. 7 only schematically shows the second conductive bridges BDG2 in the form of line segments, but this does not represent the actual shape of the second conductive bridge BDG2.

For example, as shown in FIG. 8, the bias line layer BLL includes a bias line signal terminal BLT located in the binding region, and the bias line signal terminal BLT is the end of the bias signal input line BLI located in the binding region in FIG. 7, and the bias line signal terminal BLT is also connected to a bias signal source of the circuit board; the layer where the conductive pattern is located includes a protection pattern PP located in the binding region, and the protection pattern PP is in direct contact with the bias line signal terminal BLT to protect the bias line signal terminal BLT. In the embodiments of the present disclosure, the layer where the conductive pattern is located includes the protection pattern PP located in the binding region, that is, the conductive pattern and the original protection pattern PP located in the binding region of the sensing substrate are located in the same layer, so that the conductive pattern and the protective pattern PP can be manufactured by using the same mask, and there is no need to add a new transparent conductive layer and an additional mask.

For example, the thickness of the protective pattern PP is about 500 Å-600 Å, e.g., 520 Å, and thus the thickness of the conductive pattern CP is also about 500 Å-600 Å, e.g., 520 Å.

In at least one embodiment, the bias line signal terminal BLT is electrically connected to the signal reading terminal SD1 through a hole VH4 penetrating the first passivation insulating layer PVX1, the buffer insulating layer BF, and the second passivation insulating layer PVX2, for example, the signal reading terminal SD1 is used to charge the sensing element to read the electrical signal from the drain electrode of the switching element electrically connected to the sensing element. A reading IC (Integrated Circuit) is provided in the binding region, and the reading IC records the charge amount charged to the sensing element.

In at least one embodiment, in order to simplify the manufacturing process, the signal reading terminal SD1 and the source electrode and the drain electrode of the switching element are located in the same layer, that is, formed by the same thin film.

In at least one embodiment, as shown in FIG. 2B and FIG. 3B, the sensing substrate further includes a third insulating layer IL3 located on the base substrate BS, and the third insulating layer IL3 is located on a side of the conductive pattern CP away from the base substrate BS. For example, the third insulating layer IL3 may be an inorganic insulating layer, such as a silicon nitride layer, a silicon oxide layer, or a stacked structure of the silicon nitride layer and the silicon oxide layer, or other types of inorganic insulating layers; or, the third insulating layer IL3 may be an organic insulating layer, such as resin or the like. Further covering the third insulating layer IL3 above the shielding layer does not cause etching damage to the conductive pattern CP, and can more effectively prevent the shielding failure caused by the penetration of charged ions entrained in the aqueous solution and the like into the conductive pattern. In other embodiments, the conductive pattern CP may also be exposed on the outermost layer of the product, that is, the conductive pattern CP is located on the outermost side of the sensing substrate, as shown in FIG. 2C and FIG. 3C.

As shown in FIG. 3A, in the region shown by the dotted-line frame in the lower right corner, that is, in the position where the gate line GL and the data line DL overlap with each other, the line widths of the gate line GL and the data line DL are narrowed, and an isolation layer (a small rectangular pattern in the figure) is disposed between the gate line GL and the data line DL to insulate the gate line GL and the data line DL. For example, the isolation layer is provided in the same layer as the active layer ACT.

In at least one embodiment, the sensing substrate shown in FIGS. 2A-2B and FIG. 8 can be manufactured by the following steps S1-S15.

Step S1: forming a gate electrode layer, and allowing the gate electrode layer to include a gate line GL and a gate electrode GE.

Step S2: forming a gate insulating layer GI.

Step S3: forming an active layer ACT.

Step S4: forming a source-drain electrode layer, and allowing the source-drain electrode layer to include a source electrode S, a drain electrode D, a data line DL, and a signal reading terminal SD1, thereby obtaining a switching element T.

Step S5: forming a first passivation insulating layer PVX1, and allowing the first passivation insulating layer PVX1 to have a hole VH3 penetrating the first passivation insulating layer PVX1, and the hole VH3 exposes a portion of the surface of the source electrode S.

Step S6: forming a first electrode E1, and allowing the first electrode E1 to be electrically connected to the source electrode S of the switching element T through the hole VH3.

Step S7: forming a semiconductor layer SCL.

Step S8: forming a second electrode E2, thereby obtaining the sensing element LS.

Step S9: forming a buffer insulating layer BF covering the sensing element LS and the switching element T.

Step S10: forming a first insulating layer IL1 covering the buffer insulating layer BF. For example, the first insulating layer IL1 is an organic insulating layer, such as a resin material, and the organic insulating layer has a large thickness to have a substantially flat upper surface.

Step S11: forming a second passivation insulating layer PVX2 covering the first insulating layer IL1 to form a hole VH2 penetrating the second passivation insulating layer PVX2, the first insulating layer ILL and the buffer insulating layer BF, and a hole VH4 penetrating the second passivation insulating layer PVX2, the buffer insulating layer BF, and the first passivation insulating layer PVX1. For example, the second passivation insulating layer PVX2 is an inorganic insulating layer, such as a silicon dioxide layer or a silicon nitride layer, so as to improve the adhesion between the bias signal line BL formed subsequently and the first insulating layer IL1.

Step S12: forming a bias line layer BLL, and allowing the bias line layer to include a bias signal line BL and a bias line signal terminal BLT, the bias signal line BL is electrically connected to the second electrode E2 of the sensing element LS through the hole VH2, and the bias line signal terminal BLT is electrically connected to the signal reading terminal SD1 through the hole VH4.

Step S13: forming a third passivation insulating layer PVX3 (i.e., the second insulating layer IL2) covering the bias line layer BLL and a hole VH1 penetrating the third passivation insulating layer PVX3.

Step S14: forming a transparent conductive layer on the third passivation insulating layer PVX3, and allowing the transparent conductive layer to include a conductive pattern CP and a protection pattern PP, the conductive pattern CP is electrically connected to the bias signal line BL through the hole H1, the protection pattern PP is in direct contact with the bias line signal terminal BLT, and there is no third passivation insulating layer PVX3 between the protection pattern PP and the bias line signal terminal BLT.

For example, the conductive pattern CP can be manufactured by a mask process, that is, a transparent conductive film is deposited on the third passivation insulating layer PVX3, then a photoresist is coated on the transparent conductive film, then the photoresist is exposed and developed to obtain a photoresist pattern, and then the transparent conductive film is etched by using the photoresist pattern as a mask to obtain the transparent conductive pattern CP and the transparent protection pattern PP. Alternatively, the conductive pattern CP may be formed by attachment or other methods.

Step S15: forming a third insulating layer IL3 covering the conductive pattern CP.

Compared with the manufacturing method of the sensing substrate shown in FIG. 2B, the manufacturing method of the sensing substrate of the example shown in FIG. 2C does not include the step S15.

Compared with the manufacturing method of the sensing substrate shown in FIG. 2B, the manufacturing method of the sensing substrate of the example shown in FIGS. 3A-3B does not form the hole VH1 in the step S13.

Compared with the manufacturing method of the sensing substrate shown in FIG. 3B, the manufacturing method of the sensing substrate of the example shown in FIG. 3C does not include the step S15.

It should be noted that the order of some steps in the above manufacturing method can be adjusted as required. For example, the order of steps S1 to S4 can be adjusted according to the specific structure of the switching element T, for example, the order of the step for manufacturing the bias line layer and the step for manufacturing the transparent conductive layer may be interchanged.

At least one embodiment of the present disclosure further provides an electronic device, and the electronic device comprises the sensing substrate provided by any one of the above embodiments.

In different embodiments of the present disclosure, the electronic device is, for example, an X-ray detector, an optical fingerprint sensor, an image sensor, etc. The present disclosure does not limit the application field of the electronic device.

For example, the electronic device provided by at least one embodiment of the present disclosure is a detector, and further includes a scintillator coupled to the sensing substrate, the scintillator is used to convert rays (e.g., X-rays, β-rays, or γ-rays, etc.) into light, and the sensing element LS in the sensing substrate is used to convert the light into the electrical signal.

For example, the electronic device provided by the embodiments of the present disclosure may further include a processing circuit, and the processing circuit is configured to receive an electrical signal output by the sensing element and process the electrical signal to obtain an image.

It should also be noted that, the accompanying drawings of the embodiment(s) of the present disclosure involve only the structure(s) related to the embodiment(s) of the present disclosure, and other structure(s) can be referred to common design(s); and in case of no conflict, the embodiments of the present disclosure and the features in the embodiment(s) can be combined with each other.

What have been described above are only exemplary implementations of the present disclosure and are not intended to limit the protection scope of the present disclosure, and the protection scope of the present disclosure should be determined based on the appended claims.

What is claimed is:

1. A sensing substrate, comprising:
   a base substrate,
   a first insulating layer;
   a sensing unit on the base substrate, wherein the sensing unit comprises:
      a sensing element located between the first insulating layer and the base substrate, wherein the sensing element has a light incident surface and a back surface that are opposite to each other and a side surface between the light incident surface and the back surface, the light incident surface is on a side of the back surface away from the base substrate; and
      a conductive pattern on a side of the sensing element away from the base substrate, wherein the conductive pattern has a hollow portion and a transparent conductive portion surrounding the hollow portion, and an orthographic projection of the transparent conductive portion on the base substrate at least partially overlaps with an orthographic projection of the side surface of the sensing element on the base substrate.

2. The sensing substrate according to claim 1, wherein the orthographic projection of the side surface on the base substrate is within the orthographic projection of the transparent conductive portion on the base substrate.

3. The sensing substrate according to claim 1, wherein the orthographic projection of the transparent conductive portion on the base substrate is in a closed frame structure.

4. The sensing substrate according to claim 1, wherein the conductive pattern is configured to be applied with a fixed voltage when the sensing element operates.

5. The sensing substrate according to claim 1, further comprising a bias line layer, and a second insulating layer on the base substrate,
   wherein the bias line layer comprises a bias signal line, in a direction perpendicular to the base substrate, the first insulating layer is between the sensing element and the conductive pattern; and the second insulating layer is between the bias signal line and the conductive pattern.

6. The sensing substrate according to claim 5, wherein the bias signal line is electrically connected to the sensing element and is electrically connected to the conductive pattern.

7. The sensing substrate according to claim 6, wherein the second insulating layer comprises a hole penetrating the second insulating layer, the conductive pattern is electrically connected to the bias signal line through the hole, and an orthographic projection of the hole on the base substrate at least partially overlaps with the orthographic projection of the transparent conductive portion of the conductive pattern on the base substrate.

8. The sensing substrate according to claim 7, wherein the bias signal line comprises a bias line excess portion beyond the light incident surface of the sensing element, and the bias line excess portion is electrically connected to the conductive pattern through the hole.

9. The sensing substrate according to claim 8, wherein the sensing unit further comprises a switching element, and an orthographic projection of the switching element on the base substrate is at least partially within an orthographic projection of the bias line excess portion on the base substrate.

10. The sensing substrate according to claim 5, wherein the sensing substrate comprises a plurality of sensing units spaced apart from each other, and conductive patterns of the plurality of sensing units are independent of each other.

11. The sensing substrate according to claim 5, wherein the conductive pattern is separated from the bias signal line by the second insulating layer.

12. The sensing substrate according to claim 11, wherein the sensing substrate comprises a plurality of sensing units spaced apart from each other, and comprises a plurality of first conductive bridges spaced apart from each other and a plurality of second conductive bridges spaced apart from each other on the base substrate,
   each of the plurality of first conductive bridges extends along a first direction and electrically connects conductive patterns of adjacent sensing units in the first direction, each of the plurality of second conductive bridge extends along a second direction and electrically connects conductive patterns of adjacent sensing units in the second direction, and the second direction is different from the first direction.

13. The sensing substrate according to claim 12, wherein conductive patterns of the plurality of sensing units are arranged in a plurality of conductive pattern columns, a plurality of first conductive pattern rows, and a plurality of second conductive pattern rows;
   adjacent conductive patterns in a same conductive pattern column are electrically connected through the first conductive bridge;
   adjacent conductive patterns in a same first conductive pattern row are electrically connected through the second conductive bridge;
   adjacent conductive patterns in a same second conductive pattern row are independent of each other; and
   the plurality of first conductive pattern rows and the plurality of second conductive pattern rows are alternately arranged.

14. The sensing substrate according to claim 12, wherein the bias line layer comprises a plurality of bias signal lines spaced apart from each other, an orthographic projection of each of the plurality of bias signal lines on the base substrate overlaps with orthographic projections of the first conductive bridges arranged in sequence along the first direction on the base substrate.

15. The sensing substrate according to claim 12, wherein the sensing substrate comprises a sensing region and a frame region surrounding the sensing region;

in the frame region, the sensing substrate comprises a bias short-circuit ring and a plurality of third conductive bridges spaced apart from each other on the base substrate, the bias short-circuit ring is electrically connected to conductive patterns of sensing units adjacent to the bias short-circuit ring through the plurality of third conductive bridges, respectively.

16. The sensing substrate according to claim 5, wherein the sensing substrate further comprises a binding region and a protection pattern, the bias line layer comprises a bias line signal terminal in the binding region, the protection pattern and the conductive pattern are in a same layer and in the binding region, and the protection pattern is in direct contact with the bias line signal terminal.

17. The sensing substrate according to claim 1, wherein the conductive pattern comprises a conductive pattern expansion portion beyond the light incident surface of the sensing element;

an orthographic projection of the light incident surface of the sensing element on the base substrate has a concave portion, and the concave portion accommodates an orthographic projection of at least a portion of the conductive pattern expansion portion on the base substrate.

18. The sensing substrate according to claim 1, wherein the sensing unit further comprises a switching element, the switching element is electrically connected to the sensing element, and an orthographic projection of the switching element on the base substrate is outside an orthographic projection of the light incident surface of the sensing element on the base substrate;

an orthographic projection of the conductive pattern on the base substrate overlaps with an orthographic projection of at least a portion of the switching element on the base substrate; and an orthographic projection of the hollow portion on the base substrate is at least partially within an orthographic projection of the sensing element on the base substrate.

19. The sensing substrate according to claim 1, wherein the sensing element comprises a first electrode and a second electrode disposed opposite to each other, the first electrode is between the second electrode and the base substrate in a direction perpendicular to the base substrate; and the sensing element further comprises a semiconductor layer between the first electrode and the second electrode in the direction perpendicular to the base substrate, and an orthographic projection of the transparent conductive portion on the base substrate at least partially overlaps with an orthographic projection of a side surface of the semiconductor layer on the base substrate.

20. An electronic device, comprising a sensing substrate, wherein the sensing substrate comprises:

a base substrate, a first insulating layer;

a sensing unit on the base substrate, wherein the sensing unit comprises:

a sensing element located between the first insulating layer and the base substrate, wherein the sensing element has a light incident surface and a back surface that are opposite to each other and a side surface between the light incident surface and the back surface, the light incident surface is on a side of the back surface away from the base substrate; and a conductive pattern on a side of the sensing element away from the base substrate, wherein the conductive pattern has a hollow portion and a transparent conductive portion surrounding the hollow portion, and an orthographic projection of the transparent conductive portion on the base substrate at least partially overlaps with an orthographic projection of the side surface of the sensing element on the base substrate.

* * * * *